United States Patent
Kitae et al.

(10) Patent No.: US 6,853,074 B2
(45) Date of Patent: Feb. 8, 2005

(54) ELECTRONIC PART, AN ELECTRONIC PART MOUNTING ELEMENT AND A PROCESS FOR MANUFACTURING SUCH THE ARTICLES

(75) Inventors: Takashi Kitae, Osaka (JP); Tsutomu Mitani, Hyogo (JP); Yukihiro Ishimaru, Osaka (JP); Hiroaki Takezawa, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/747,976

(22) Filed: Dec. 27, 2000

(65) Prior Publication Data

US 2001/0005053 A1 Jun. 28, 2001

(30) Foreign Application Priority Data

Dec. 27, 1999 (JP) .......................................... P11-369832
Mar. 8, 2000 (JP) ..................................... P2000-062983

(51) Int. Cl.[7] .......................... H01L 23/04; H01L 23/48; H01L 23/52; H01L 23/34
(52) U.S. Cl. ........................ 257/730; 257/690; 257/692; 257/693; 257/783; 257/784; 257/701; 257/724; 257/697; 257/737; 257/789
(58) Field of Search ................................ 257/730, 690, 257/692, 783, 784, 701, 724, 787, 789, 737, 697, 693, 736, 703; 361/321.3

(56) References Cited

U.S. PATENT DOCUMENTS 5,277,723 A * 1/1994 Kodama et al. ............... 156/89
5,632,833 A * 5/1997 Kurano et al. ............... 427/125
5,822,176 A * 10/1998 Sano et al. ............... 361/321.4
5,952,717 A * 9/1999 Taniguchi et al. ........... 257/734
6,137,183 A * 10/2000 Sako ........................... 257/783
6,249,049 B1 * 6/2001 Kamada et al. ............. 257/703
6,264,785 B1 * 7/2001 Ikeda ....................... 156/273.3
6,271,060 B1 * 8/2001 Zandman et al. ........... 438/113
6,274,968 B1 * 8/2001 Wajima et al. .............. 310/348
2001/0026017 A1 * 10/2001 Seto ........................... 257/736

FOREIGN PATENT DOCUMENTS

JP          7312302         11/1995

* cited by examiner

*Primary Examiner*—Nitin Parekh
(74) *Attorney, Agent, or Firm*—McDermott Will & Emery LLP

(57) ABSTRACT

A surface of an external electrode 3 of an electronic part 4 is formed with a coating containing resin ingredient. Thereby, adhesion strength and reliability may be significantly improved in mounting an electronic part onto a circuit board 1 through the medium of a conductive adhesive. Further, it will be able to mount an electronic part to an element to be mounted by utilizing a conductive adhesive forming an external electrode 3 as a connecting element.

Further, surface roughness ($R_a$) of an external electrode 3 of an electronic part is set to 0.1 μm or more and to 10.0 μm or less and preferably to 1.0 μm or more and to 5.0 μm or less. Thereby, adhesion strength with a conductive adhesive may be significantly enhanced in comparison with a conventional electronic part presented.

16 Claims, 2 Drawing Sheets

ELECTRONIC PART, AN ELECTRONIC PART MOUNTING ELEMENT AND A PROCESS FOR MANUFACTURING SUCH THE ARTICLES

BACKGROUND OF THE INVENTION

1. Field of the Invention

The present invention relates an electronic part, an electronic part mounting element and a process for manufacturing such the articles.

2. Description of the Related Art

There is recently a growing acknowledgment on the environmental problem and therefore regulations by laws are being imposed on the lead in the solder alloy in the field of electronics mounting. Therefore, it is an urgent necessity to establish the joining technology which does not use lead for mounting of the electronic part. As the mounting technology which does not use lead, the technology which utilizes a lead-free solder and that which utilizes a conductive adhesive are mainly given. Among them, the mounting structure which utilizes a conductive adhesive draws the attention because the advantage of the flexibility of the joining part, lowering the temperature of mounting and the like is expected.

A conductive adhesive is generally configured by dispersing a conductive filler in the adhesion ingredient based on resin. The conductive adhesive layer electrically connects an external electrode of an electronic part to a connecting terminal of a circuit board by curing a resin ingredient of the conductive adhesive layer after the conductive adhesive layer is interposed between the electronic part and the circuit board. Then, conduction of electricity of a connecting portion is ensured through a contact among the conductive fillers. Because said connecting portion adhered through resin, the conductive adhesive is flexible for a deformation due to heat and external forces and resistant to cracking in the connecting portion compared with solder in which said connecting portion is an alloy. Further, the conductive adhesive may be cured at a lower temperature than that in solder. From such a reason, the conductive adhesive is expected as an alternative material to solder.

However, when the current conductive adhesive is used in mounting the electronic part having a solder-plating electrode generally supplied at present to the circuit board, it is sometimes difficult to use it for actual applications since sufficient adhesion strength and reliability may not be attained.

And, an electronic part having a tin-plating electrode also is supplied as a mounting structure of lead-free permeates. However, in a structure mounted by the conductive adhesive upon the tin-plating electrode, adhesion strength and reliability is considerably low compared with the conventional soldered connection.

As described above, when the electronic part having a metal electrode represented with a solder-plating electrode and a tin-plating electrode is intended to mount to the circuit board by using the conductive adhesive, sufficient adhesion strength and reliability may not be attained sometimes.

This results from that the external electrode of the electronic part supplied at present is designed to suit with the soldered connection and it is necessary to change the external electrode of the electronic part to the specifications suitable for a connection by the conductive adhesive.

Further, the destruction due to detachment in a mounting structure using the conductive adhesive occurs at the contacting interface between the conductive adhesive and the electrode. Most of the surfaces of the external electrodes (applied with solder plating or tin plating) of the electronic parts supplied at present are smoothed to suit with the soldered connection. Therefore, connecting strength at the contacting interface where the destruction due to detachment occurs may not be sufficiently retained and this causes that adhesion strength may not be sufficiently attained.

SUMMARY OF THE INVENTION

Accordingly, it is a principal object of the present invention to provide an electronic part, an electronic part mounting element and an process for manufacturing such the articles which may attain sufficient adhesion strength and reliability in mounting an electronic part utilizing a conductive adhesive in place of solder.

To attain the above object, a coating containing resin ingredient is provide on the surface of the external electrode of the electronic part in the present invention. Thereby, when a conductive adhesive is used as a connecting element in mounting an electronic part to an element to be mounted, an affinity between the external electrode of the electronic part and the connecting element becomes better and therefore the adhesion strength is improved.

Further, preferably, a conductive adhesive layer is provided on said coating and said conductive adhesive layer contains a conductive filler consisting of gold, silver, platinum, nickel, zinc, palladium, or an alloy or a mixture containing these metals, and thereby it will be able to mount the electronic part directly to the element to be mounted.

Further, preferably, said coating contains a conductive filler consisting of gold, silver, platinum, nickel, zinc, palladium, or an alloy or a mixture containing these metals, and thereby it will be unnecessary to provide a connecting element comprising the conductive adhesive separately between the electronic part and the element to be mounted since said coating may have conductivity.

Further, preferably, the thickness of said coating is less than the particle diameter of said conductive filler, and thereby it will be able to attain good conductivity as the conductive adhesive abuts surely against the external electrode in mounting the electronic part to the element to be mounted.

Further, in the present invention, a electronic part has a external electrode comprising a coating of a conductive adhesive and said conductive adhesive contains a conductive filler consisting of gold, silver, platinum, nickel, zinc, palladium, or an alloy or a mixture containing these metals. Thereby, in mounting the electronic part to the element to be mounted, the affinity between the external electrode of the electronic part and the connecting element becomes better and therefore the adhesion strength is enhanced.

Further, in the present invention, an electronic part mounting element is configured by having an electronic part, a coating which contains a resin ingredient and is formed on the surface of the external electrode of said electronic part, an element to be mounted with said electronic part and a conductive adhesive which contains a conductive filler consisting of gold, silver, platinum, nickel, zinc, palladium, or an alloy or a mixture containing these metals and which electrically connects the external electrode of said electronic part to the connecting terminal of said element to be mounted. Thereby, the affinity between the external electrode of the electronic part and the connecting element becomes better and therefore the adhesion strength is improved.

Further, preferably, said coating and said conductive adhesive are unified and thereby adhesion strength and reliability is more improved.

Further, preferably, a joining portion of said coating with said conductive adhesive is shaped like a fillet, and thereby adhesion strength and reliability is more improved.

Further, in the present invention, an electronic part mounting element is configured by forming a coating of a conductive adhesive which contains a conductive filler consisting of gold, silver, platinum, nickel, zinc, palladium, or an alloy or a mixture containing these metals containing on the surface of the external electrode of the electronic part and by electrically connecting the external electrode of said electronic part to the connecting terminal of an element to be mounted, utilizing said coating as a connecting element. Thereby, it will be able to mount the electronic part directly to the element to be mounted without providing the connecting element additionally.

Further, in the present invention, after forming a coating containing a resin ingredient on the surface of the external electrode of the electronic part, said external electrode of said electronic part is electrically connected to the connecting terminal of an element to be mounted by using a conductive adhesive which contains a conductive filler consisting of gold, silver, platinum, nickel, zinc, palladium, or an alloy or a mixture containing these metals. Thereby, the affinity between the external electrode of the electronic part and the connecting element becomes better and therefore the adhesion strength is improved.

Further, in the present invention, after forming a coating of a conductive adhesive which contains a conductive filler consisting of gold, silver, platinum, nickel, zinc, palladium, or an alloy or a mixture containing these metals on the surface of the external electrode of the electronic part, said external electrode of said electronic part is electrically connected to the connecting terminal of an element to be mounted, utilizing said coating as a connecting element. Thereby, the electronic part may be mounted directly to the element to be mounted without providing the connecting element additionally.

Further, preferably, said coating is thermally cured after said coating is formed on the surface of the electronic part in a half-cured condition in connecting the electronic part to the element to be mounted, and thereby, the electronic part may be mounted directly to the element to be mounted without providing the additional connecting element.

Further, in the present invention, surface roughness ($R_a$) of the external electrode of the electronic part is set to 0.1 $\mu$m or more and to 10.0 $\mu$m or less. Thereby, the adhesion strength with the conductive adhesive is improved and the same level of the adhesion strength as a conventional soldered connection may be obtained.

Further, preferably, said surface roughness ($R_a$) is set to 1.0 $\mu$m or more and to 5.0 $\mu$m or less and thereby the adhesion strength is more enhanced in mounting the electronic part to the element to be mounted through the medium of the conductive adhesive.

BRIEF DESCRIPTION OF THE DRAWINGS

Other and further objects of the invention will become obvious upon an understanding of the illustrative embodiments about to be described or will be indicated in the appended claims, and various advantages not referred to herein will occur to one skilled in the art upon employment of the invention in practice.

DETAILED DESCRIPTION OF THE INVENTION

In the following are described preferred examples of the present invention taken in connection with drawings.

First Preferable Embodiment

Figure 1:
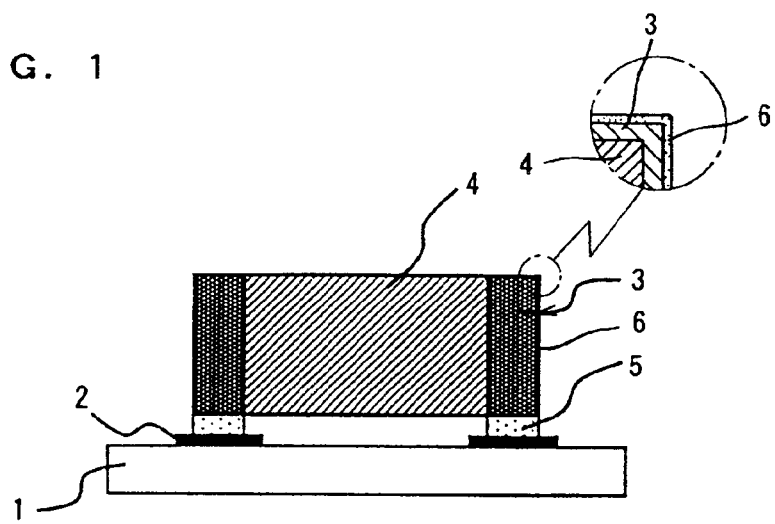
FIG. 1 is a sectional view of an electronic part mounting element according to the first preferable embodiment of the present invention.

FIG. 1 is a sectional view of an electronic part mounting element according to the first preferable embodiment of the present invention.

An external electrode 3 of an electronic part 4 has an adhesive layer 6 on the surface. The adhesive layer 6 contains conductive filler and functions as a conductive adhesion. The electronic part 4 is mounted to a circuit board 1, an element to be mounted, through the medium of a connecting element 5 consisting of a conductive adhesive. The external electrode 3 is electrically connected to a connecting terminal 2 by the adhesive layer 6 and the connecting element 5.

The adhesive layer 6 may be formed only by resin ingredient not containing a conductive filler. In such an adhesive layer, it is required to form the thickness of the adhesive layer 6 less than the particle diameter of a conductive filler contained in the connecting element 5. Hereinafter, the reason thereof is described.

The conductive filler which contributes to conduction of electricity in the conductive adhesive is electrically connected to the external electrode 3 by breaking through the adhesive layer 6 to abut against the external electrode 3. Therefore, when the thickness of the adhesive layer 6 is not set less than the particle diameter of the conductive filler, the conductive filler does not break through the adhesive layer 6 to abut surely against the external electrode 3 and causes a poor conduction. For such a reason, the thickness of the adhesive layer 6 is set less than the particle diameter of the conductive filler contained in the connecting element 5.

In an electronic part mounting element of FIG. 1, when an affinity between an adhesive layer 6 of an electronic part 4 and a conductive adhesive composing a connecting element 5 is low, resulting the adhesion strength and the connection reliability are insufficient between both of them. Therefore, it is preferable to form the adhesive layer 6 and the connecting element 5 by using the same kind of resins and thereby conformability between the adhesive layer 6 and the connecting element 5 is improved to attain sufficient adhesion strength and reliability.

Further, when the adhesive layer 6 and the connecting element 5 are respectively composed of resins having a high affinity respectively, these resins takes on a structure combined into one element after thermally curing and it will be often unable to distinguish these resins each other. In such an electronic part mounting element, an electronic part mounting element having good adhesion strength and reliability may be obtained.

Figure 3:
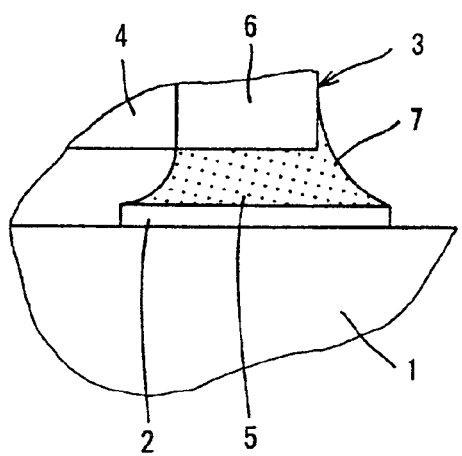
FIG. 3 is a sectional view of an electronic part mounting element according to the second preferable embodiment of the present invention.

Further, when the adhesive layer 6 and the connecting element 5 are respectively composed of resins having a high affinity respectively, the connecting element 5 (conductive adhesive) forms a fillet 7 as shown in FIG. 3 after thermally curing and therefore the adhesion strength between the connecting element 5 and the adhesive layer 6 significantly enhanced. As a combination of resins having good affinity, for example, the same kind of resins (epoxy resin respectively) may preferably be used.

Further, in the combination of the adhesive layer 6 and the connecting element 5, even when the kinds and shapes of the conductive fillers are different between them, the differences can not affect the adhesion strength and the reliability by large amounts.

Second Preferable Embodiment

Figure 2:
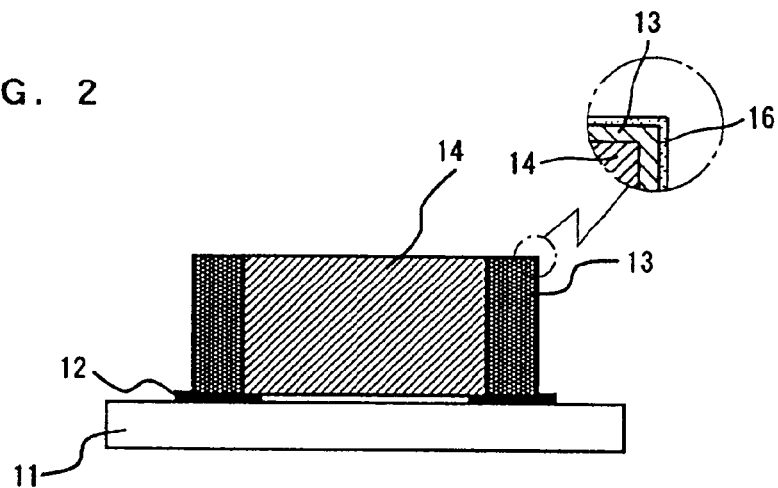
FIG. 2 is an enlarged view of an essential portion of the first embodiment.

FIG. 2 is a sectional view of an electronic part mounting element indicating the second preferable embodiment of the present invention.

In this embodiment, an external electrode 13 of an electronic part 14 is provided with a conductive adhesive layer 16 on the surface. The electronic part 14 is mounted to a circuit board 11, an element to be mounted, utilizing a conductive adhesive layer 16 as a connecting element 5. In this case, a connecting terminal 12 of the circuit board 11 is electrically connected to the external electrode 13 of the electronic part 14 by the conductive adhesive layer 16.

Further, in this embodiment, the conductive adhesive layer 16 is composed of a conductive adhesive containing a thermoplastic polymer in an amount 1 weight percent or more. The conductive adhesive layer 16 composed like this allows the electronic part 14 to be mounted to the circuit board 11 by thermal pressing.

Further, the conductive adhesive layer 16 may also be composed of a conductive adhesive containing a thermosetting adhesive. In this case, the conductive adhesive layer 16 may be formed on the electronic part in a half-cured condition. Thus, the electronic part 14 may be mounted to the circuit board 11 by thermally curing.

Third Preferable Embodiment

Figure 4:
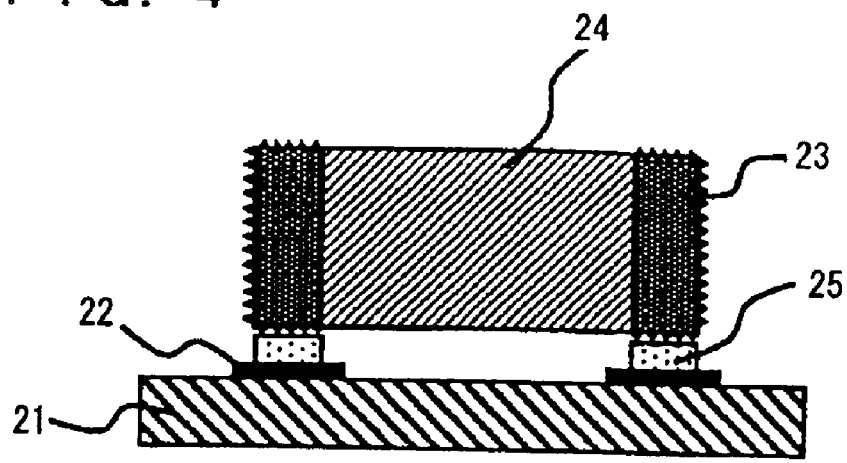
FIG. 4 is a sectional view of an electronic part mounting element according to the third preferable embodiment of the present invention.

FIG. 4 is an electronic part mounting element indicating the third preferable embodiment of the present invention.

In this embodiment, a surface of an external electrode 23 of an electronic part 24 consisting of a jumper resistance in 3216 size is roughened. And, the external electrode 23 of the electronic part 24 is electrically connected to the connecting terminal 22 of the circuit board 21 through the medium of the connecting element 25 consisting of the conductive adhesive.

Fourth Preferable Embodiment

Figure 5:
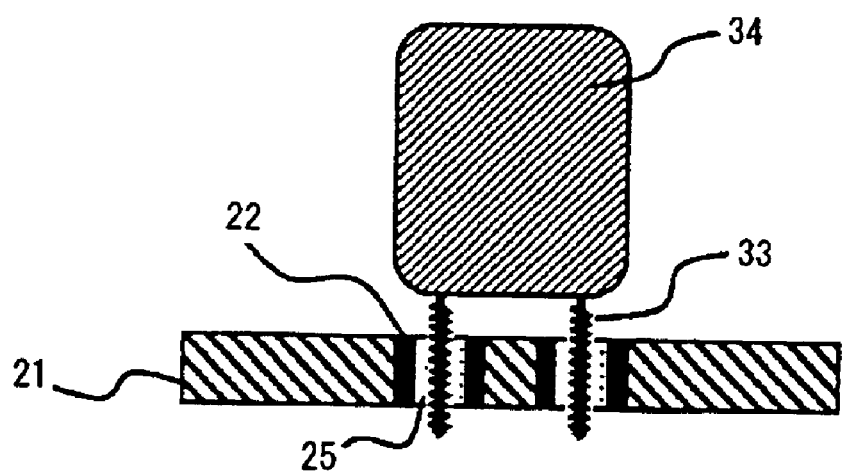
FIG. 5 is a sectional view of an electronic part mounting element according to the fourth preferable embodiment of the present invention.

FIG. 5 is an electronic part mounting element in the fourth preferable embodiment of the present invention.

In this embodiment, a surface of a lead electrode 33, an external electrode of an electronic part 34 consisting of an electrolytic capacitor, is roughened. By the way, this embodiment has a structure which is essentially similar to the third embodiment except having different kinds of electronic part 34. Therefore, in FIG. 5, a portion which is same as or similar to that of the third embodiment (FIG. 4) is designated with the same symbol.

Fifth Preferable Embodiment

Figure 6:
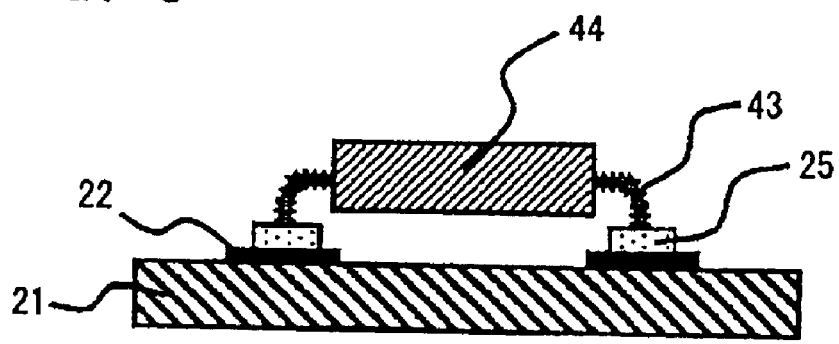
FIG. 6 is a sectional view of an electronic part mounting element according to the fifth preferable embodiment of the present invention.

FIG. 6 is an electronic part mounting element in the fifth preferable embodiment of the present invention.

In this embodiment, a surface of a lead electrode 43 of an electronic part 44, QFP (Quad Flat Package), is roughened. By the way, this embodiment has a structure which is essentially similar to the third embodiment except having different kinds of electronic part 44. Therefore, in FIG. 6, a portion which is same as or similar to that of the third embodiment (FIG. 4) is designated with the same symbol.

In from third to fifth embodiments described above, after surface portions of a external electrode and a lead electrode are composed of gold, silver, platinum, nickel, zinc, palladium, or an alloy or a mixture containing these metals, the surface portions of external electrodes are roughened. Noble metals such gold, silver and platinum among these materials are high in moisture resistance and oxidation resistance and may preferably be used as a material for a surface portion of a electrode.

Further, as a material of a surface portion of a electrode described above, sintered material (a sintered silver, sintered copper and the like) may preferably be used. The reason of this is that a surface of metal composing an external electrode and a lead electrode is roughened by sintering and therefore it will not require for a process to roughen additionally. As a electronic part formed with a sintered metal on the surface portion of the external electrode and the lead electrode, an electronic part of which the surface portion of the external electrode and the lead electrode is coated by a sintered silver or a sintered copper is readily available and may preferably be used.

From such a reason, considering enhancement of adhesion strength, moisture resistance and oxidation resistance, a procedure to get parts and its cost, an electronic part using a sintered silver as a surface portion of a electrode external electrode and a lead electrode is most preferable in the third to fifth embodiments. Also, an electronic part using a sintered copper as a surface portion of an external electrode and a lead electrode are composed may preferably be used.

However, the surface roughness may also is adjusted by adjusting a paste ingredient of a conductive adhesive as a material forming the external electrode and the lead electrode. Specifically, for example, the size of a void formed on the surface portions of the external electrode and the lead electrode may be controlled by adjusting an amount of solvent contained in paste ingredient of a conductive adhesive and thereby the surface roughness may also be adjusted.

In above embodiment, as a conductive filler composing a conductive adhesive, gold, silver, platinum, nickel, zinc, palladium, or an alloy or a mixture containing these metals may be preferably utilized. However, a solder filler consisting of metal materials such as tin, lead and the like is excluded from a material for the conductive filler used in the present invention. The reason for this is that it is hard to remain an electrical characteristic for the long term due to the fact that the solder filler is subject to oxidation. However, a filler which is plated on the solder filler with the above metals (gold etc.) referred as to be applicable in the present invention may preferably be utilized in the present invention.

In the embodiments described above, when the adhesive layer, the conductive adhesive layer and the connecting element are composed of a conductive adhesive containing a thermoplastic polymer in an amount 1 weight percent or more, the electronic part may be removed from the circuit board by thermally processing even after mounting. Thus, the reuse of the electronic part and the circuit board will be possible. In this case, a heating temperature and a heating period may adequately be determined corresponding to the kind and the content of a thermoplastic polymer.

In the first to the third embodiments described above, the adhesive layer and the conductive adhesive layer are not required for forming all over the surface of the external electrode and the adhesive layer and the conductive adhesive layer may be selectively provided to the partial area of the external electrode as required, for example, in such a way that these are provided only to the portion contacting with the connecting terminal of the circuit board.

In each embodiment described above, the kind of an applicable electronic part is not limited as far as it is a part which is generally used as a electronic part like a condenser, a resistance, a coil and a semiconductor. Further, a surface mounting part and a lead part are not limited in the shape. Further, as resin ingredient composing the adhesive layer and the conductive adhesive layer, any of a thermoplastic polymer, a thermosetting plastic and a mixture of these plastic may be used. A shape and a size of the conductive filler contained in the adhesive layer and the conductive adhesive layer also is not limited particularly. And, as the external electrode of the electronic part, any of a single-layer electrode and multi-layers electrode may be used. In multi-layer electrode, the specifications (material etc.) of inner layer are not questioned particularly. The procedure of forming the adhesive layer and the conductive adhesive layer on the surface of the external electrode is not questioned particularly.

Hereinafter, each example of the present invention is described.

At first, there are described examples 1 to 5, example 7 and reference 1 which are respectively the examples and the reference thereof of the first and the second embodiments described above. In these examples and reference, after an electronic part consisting of a jumper tip resistance in 3216 size is mounted on a circuit board comprising a glass epoxy resin and having a connecting terminal of a copper electrode pattern, a electronic part mounting element was configured by thermally curing at a temperature of 150° C. for 1 hour in an oven.

In examples 1 to 5 and example 7, each electronic part mounting element is configured by applying a configuration of the first embodiment described above. In example 6, an electronic part mounting element is configured by applying a configuration of the second embodiment.

EXAMPLE 1

In this example, as an adhesive layer 6, the conductive adhesive based on an epoxy resin as thermosetting resin, and a silver filler was used. As a connecting element 5, the conductive adhesive which is based on an epoxy resin and a silver filler but different in a kind from the adhesive layer 6 was used.

EXAMPLE 2

In this example, as an adhesive layer 6, the conductive adhesive based on an epoxy resin as thermosetting resin, and a silver filler was used. As a connecting element 5, the conductive adhesive based on a urethane resin as thermoplastic resin, and a silver filler was used.

EXAMPLE 3

In this example, as an adhesive layer 6, the conductive adhesive based on a urethane resin as thermoplastic resin, and a silver filler was used. As a connecting element 5, the conductive adhesive based on an epoxy resin as thermosetting resin, and a silver filler was used.

EXAMPLE 4

In this example, as an adhesive layer 6, the conductive adhesive based on a urethane resin as thermoplastic resin, and a silver filler was used. As a connecting element 5, the conductive adhesive based on a urethane resin as thermoplastic resin, and a silver filler was used.

EXAMPLE 5

In this example, as an adhesive layer 6, the conductive adhesive which was based on an epoxy resin as thermosetting resin, and a silver filler and contains a urethane resin as thermoplastic resin, in an amount 1 weight percent was used. As a connecting element 5, the conductive adhesive based on an epoxy resin as thermosetting resin, and a silver filler was used.

EXAMPLE 6

In this example, as a conductive adhesive layer 16, the conductive adhesive which was based on an epoxy resin as thermosetting resin, and a silver filler and contains a urethane resin as thermoplastic resin, in an amount 1 weight percent was used.

EXAMPLE 7

In this example, as a adhesive layer 6, the adhesive which was based on an epoxy resin as thermosetting resin, and does not contains a conductive filler was used. As a connecting element 5, the conductive adhesive based on an epoxy resin as thermosetting resin, and a silver filler were used.

Reference 1

In this reference, as a connecting element, the conductive adhesive based on an epoxy resin as thermosetting resin, and a silver filler was used.

In Table 1 there are given the results of measuring the shearing strength measured by the shearing strength test which press a electronic part laterally to test, the initial resistance value and the resistance value after 100 hours of the moisture resistance test (temperature 85° C./relative humidity 85%) respectively on electronic part mounting elements in examples 1 to 7 and reference 1 described above.

TABLE 1

| External electrode of electronic part | Connecting element | Shear strength (kgf) | Initial resistance value (mΩ) | Resistance value after moisture resistance test (mΩ) | |
|---|---|---|---|---|---|
| Solder plating | Thermosetting conductive adhesive | 2.4 | 30 | 150 | Reference 1 |
| Thermosetting conductive adhesive | Thermosetting conductive adhesive | 4.4 | 30 | 27 | Example 1 |
| Thermosetting conductive adhesive | Thermoplastic conductive adhesive | 3.3 | 30 | 35 | Example 2 |
| Thermoplastic conductive adhesive | Thermosetting conductive adhesive | 4.2 | 30 | 31 | Example 3 |
| Thermoplastic conductive adhesive | Thermoplastic conductive adhesive | 3.2 | 30 | 35 | Example 4 |
| Thermosetting conductive adhesive containing | Thermosetting conductive adhesive | 4.4 | 30 | 30 | Example 5 |

TABLE 1-continued

| External electrode of electronic part | Connecting element | Shear strength (kgf) | Initial resistance value (mΩ) | Resistance value after moisture resistance test (mΩ) | |
|---|---|---|---|---|---|
| thermoplastics by 1 wt. % Thermosetting conductive adhesive containing thermoplastics by 1 wt. % | None | 4.6 | 28 | 30 | Example 6 |
| Forming a thin film of epoxy base adhesive not containing conductive filler | Thermosetting conductive adhesive | 4.3 | 30 | 28 | Example 7 |

In examples 1 to 7, the resulting adhesion strength was about two times larger than that of reference 1. In reference 1, adhesion strength between an external electrode of an electronic part (a solder plating layer) and a connecting element (a conductive adhesive) was low and therefore the electronic part was readily removed from a circuit board. Incidentally, an interfacial detachment occurred principally in a detachment mode in reference 1.

And, in examples 1 to 7, the resistance values after the moisture resistance test were substantially equal to the initial resistance value.

Then, each example of the third to the fifth embodiments is described. Herein, though example of the third embodiment is described as a representative example of these embodiments, needless to say, the similar measurements were obtained in the fourth and the fifth embodiments.

In examples 8 to 17 and examples 18 to 23, an electronic part mounting element mounted with an electronic part having an external electrode with varying surface roughness respectively was prepared. In references 2 and 3 and reference 4 and 5, an electronic part mounting element mounted with a electronic part having an external electrode with surface roughness ($R_a$) departing from the range specified by the present invention was prepared. And, a jumper tip resistance in 3216 size was used as an electronic part.

In examples 8 to 17 and reference 2, surface roughness (Ra) were set by means that external electrodes 23 of an electronic part were composed of eleven kinds of sintered silvers which were different in composition. In reference 3, an external electrode was formed by solder plating and thereby surface roughness (Ra) was brought to depart from the range specified by the present invention and to be smooth.

In examples 18 to 23 and reference 4, surface roughness (Ra) were set by means that external electrodes 23 of an electronic part were composed of seven kinds of sintered coppers which were different in composition.

In examples 8 to 17 and references 2 and 3, as a connecting element, the first conductive adhesive A and the second conductive adhesive B respectively based on an epoxy resin (a thermosetting resin) and a silver filler were used. The first conductive adhesive A contains a silver filler in an amount 90 weight percent. The second conductive adhesive B contains a silver filler in an amount 80 weight percent.

In examples 18 to 23 and references 4, as a connecting element, the first conductive adhesives A were used.

In each example and each reference, as a circuit board, a glass epoxy resin board having a connecting terminal consisting of a copper electrode pattern was used.

And, examples 8 to 17, examples 18 to 23 and references 2 to 4 were prepared by mounting the electronic parts on the circuit boards respectively, using the first conductive adhesive A or the second conductive adhesive B and by thermally curing at a temperature of 150° C. for 1 hour in an oven.

EXAMPLE 8

Surface roughness ($R_a$) was set to 0.11 μm in this example.

EXAMPLE 9

Surface roughness ($R_a$) was set to 0.52 μm in this example.

EXAMPLE 10

Surface roughness ($R_a$) was set to 0.85 μm in this example.

EXAMPLE 11

Surface roughness ($R_a$) was set to 1.1 μm in this example.

EXAMPLE 12

Surface roughness ($R_a$) was set to 2.3 μm in this example.

EXAMPLE 13

Surface roughness ($R_a$) was set to 4.5 μm in this example.

EXAMPLE 14

Surface roughness ($R_a$) was set to 5.0 μm in this example.

EXAMPLE 15

Surface roughness ($R_a$) was set to 6.0 μm in this example.

EXAMPLE 16

Surface roughness ($R_a$) was set to 8.3 μm in this example.

EXAMPLE 17

Surface roughness ($R_a$) was set to 9.8 μm in this example.

Reference 2

Surface roughness ($R_a$) was set to 12.0 μm in this reference.

Reference 3

Surface roughness ($R_a$) was set to 0.085 μm by forming a surface portion of an external electrode of electronic part with solder plating in this reference.

EXAMPLE 18

Surface roughness ($R_a$) was set to 0.12 μm in this example.

EXAMPLE 19

Surface roughness ($R_a$) was set to 0.85 μm in this example.

EXAMPLE 20

Surface roughness ($R_a$) was set to 1.3 μm in this example.

EXAMPLE 21

Surface roughness ($R_a$) was set to 4.7 μm in this example.

EXAMPLE 22

Surface roughness ($R_a$) was set to 6.3 μm in this example.

EXAMPLE 23

Surface roughness ($R_a$) was set to 9.5 μm in this example.

Reference 4

Surface roughness ($R_a$) was set to 10.8 μm in this reference.

In Table 2 there are given the results of performing the shearing strength test (performed by pressing a electronic part laterally), the moisture resistance test and the migration resistance test respectively on electronic part mounting elements in examples 8 to 17 and reference 2,3. Also, In Table 2 there are given the results of performing the shearing strength test and the moisture resistance described above on electronic part mounting elements in examples 18 to 23 and reference 4.

Further, in the moisture resistance test, it was measured how much the resistance value increased (hereinafter, referred to as the resistance value increasing rate (%)) after being left under an environmental condition of temperature of 85° C. and relative humidity of 85% for a predetermined period of time (200 or 1000 hours) relative to the resistance value before being left. And, as a connecting element, the first conductive adhesive A was used.

The test conditions in the migration resistance test were set as follows. That is, the migration resistance of the electronic part mounting element was evaluated after the electronic part mounting element was left under an environmental condition of high temperature and high humidity (temperature 85° C./relative humidity 85%) for a predetermined period of time (1000 hours), feeding a constant current (10 mA) through the electronic part mounting element. Specifically, the migration resistance was evaluated by examining an extent of growth of the dendrite (one into which deposited silver grows like a soft rime) through a visual inspection on the electronic part mounting element. And, as a connecting element, the first conductive adhesive A was used.

TABLE 2

| | Surface roughness $R_a$ (μm) | Shear strength (kgf) Conductive adhesive A | Shear strength (kgf) Conductive adhesive B | Resistance value increasing rate in moisture resistance test (%) 200 h | Resistance value increasing rate in moisture resistance test (%) 500 h | Migration test | |
|---|---|---|---|---|---|---|---|
| Solder plating | 0.085 | 2.5 | 2.6 | 100 | 500 | ○ | Reference 3 |
| Electrode part of sintered silver | 0.11 | 3.0 | 3.1 | 0 | 3 | ○ | Example 8 |
| Electrode part of sintered silver | 0.52 | 3.0 | 2.9 | 0 | 3 | ○ | Example 9 |
| Electrode part of sintered silver | 0.85 | 3.1 | 3.2 | 1 | 5 | ○ | Example 10 |
| Electrode part of sintered silver | 1.1 | 3.7 | 4.0 | 0 | 2 | ○ | Example 11 |
| Electrode part of sintered silver | 2.3 | 3.6 | 3.9 | 2 | 2 | ○ | Example 12 |
| Electrode part of sintered silver | 4.5 | 3.9 | 4.3 | 5 | 5 | ○ | Example 13 |
| Electrode part of sintered silver | 5.0 | 3.7 | 4.1 | 5 | 10 | ○ | Example 14 |
| Electrode part of sintered silver | 6.0 | 3.9 | 4.2 | 10 | 60 | Δ | Example 15 |
| Electrode part of sintered silver | 8.3 | 4.0 | 4.4 | 10 | 50 | Δ | Example 16 |
| Electrode part of sintered silver | 9.8 | 4.0 | 4.5 | 15 | 90 | Δ | Example 17 |
| Electrode part of sintered silver | 12.0 | 4.1 | 4.5 | 55 | 130 | X | Reference 2 |
| Electrode part of sintered copper | 0.12 | 3.3 | — | 3 | 3 | — | Example 18 |
| Electrode part of sintered copper | 0.85 | 3.3 | — | 3 | 10 | — | Example 19 |
| Electrode part of sintered copper | 1.3 | 4.5 | — | 5 | 3 | — | Example 20 |
| Electrode part of sintered copper | 4.7 | 4.8 | — | 5 | 10 | — | Example 21 |
| Electrode part of sintered copper | 6.3 | 4.9 | — | 10 | 70 | — | Example 22 |
| Electrode part of sintered copper | 9.5 | 4.8 | — | 15 | 120 | — | Example 23 |
| Electrode part of sintered copper | 10.8 | 4.7 | — | 120 | 230 | — | Reference 4 |

At first, a measurement of the shearing strength is described. In examples 8 to 17 and 18 to 23 in which surface roughness ($R_a$) of the external electrode was set to 0.1 μm or more by using a sintered silver or a sintered copper as the external electrode of the electronic part, it was found that the adhesion strength was more enhanced than reference 3 (surface roughness ($R_a$) 0.085 μm: solder plating) in any conductive adhesive. Further, in examples 11 to 17 and 20 to 23 in which surface roughness ($R_a$) of the external electrode was set to 1.0 μm or more, more enhancement of the adhesion strength as high as 3.7 kgf or more was found in any conductive adhesive.

On the other hand, in reference 3 in which surface roughness ($R_a$) is less than 0.1 μm, sufficient adhesion strength was not attained and this is not suitable for the actual use. More specifically, the adhesion strength with the conductive adhesive is low and therefore the electronic part is readily removed from the circuit board in reference 3.

Thus, it may be understood from the measurements of the shearing strength that the surface roughness ($R_a$) of the external electrode is preferred to set to 0.1 μm or more and optimal to set to 1.0 μm or more.

Then, a measurement of the moisture resistance test is described. In reference 2 (surface roughness ($R_a$) of the external electrode is 12.0 μm) and reference 4 (surface roughness ($R_a$) of the external electrode is 10.8 μm), the resistance value increased by large amounts. That is, the resistance value increasing rate (%) in reference 2 was 55% after 200 hours and 130% after 500 hours. The resistance value increasing rate (%) in reference 4 was 120% after 200 hours and 230% after 500 hours.

Also, in reference 3 (surface roughness ($R_a$) of the external electrode is 0.085 μm) the resistance value increased by large amounts. That is, the resistance value increasing rate (%) in reference 3 was 100% after 200 hours and 500% after 500 hours.

On the contrary, in examples 8 to 17 and 18 to 23, the resistance value increasing rate (%) was suppressed by large amounts in comparison with references 2 and 4. That is, the resistance value increasing rate (%) in examples 8 to 17 was 15% or less after 200 hours and 90% or less after 500 hours. And, the resistance value increasing rate (%) in examples 18 to 23 was 15% or less after 200 hours and 120% after 500 hours.

Further, it is generally referred to be preferred for actual use that a resistance value increasing rate (%) of an electronic part mounting element is within 20%. In examples 8 to 17 and 18 to 23 (surface roughness ($R_a$) of the external electrode is 10.0 μm or less), the resistance value increasing rate (%) was at most 15% after being left for 200 hours, and therefore these results satisfy with the above requirements (within 20%). Also, in examples 8 to 14 and 18 to 21 (surface roughness of the external electrode 5.0 μm or less), the resistance value increasing rate (%) was at most 10% after being left for 500 hours, and therefore these results satisfy with the above requirements (within 20%).

It may be understood from the measurements of the moisture resistance tests described above that surface roughness of the external electrode is preferred to set to 0.1 μm or more and to 10.0 μm or less and optimal to set to 5.0 μm or less.

Then, the measurement of the migration resistance test is described. In reference 2 (surface roughness of the external electrode 12.0 μm), a dendrite grew and therefore a short circuit occurred. On the one hand, in example 15 (surface roughness of the external electrode 6.0 μm), a short circuit did not occur but a relatively large size of dendrite was found. On the other hand, in examples 8 to 14 in which surface roughness of the external electrode is 5.0 μm or less, any large size of dendrite was not found.

It may be understood from the measurements of the migration resistance tests described above that surface roughness of the external electrode is preferred to set to 10.0 μm or less and optimal to set to 5.0 μm or less.

It may be understood from the measurements of examples described above that surface roughness of the external electrode is preferred to set to 0.1 μm or more and to 10.0 μm or less, and optimal to set to 1.0 μm or more and to 5.0 μm or less.

As described above, in the first embodiment, conformability between an conductive adhesive provided as a connecting element and an external electrode of an electronic part is improved by providing a adhesive layer containing resin ingredient on an external electrode of an electronic part and therefore sufficient adhesion strength and reliability may be attained. Thus, it may be realized that an electronic part and an electronic part mounting element are respectively brought to be lead-free.

Further, as shown in the second embodiment, the adhesive layer provided on the external electrode may be used as a connecting element. In that case, it will be unnecessary to provide an additional conductive adhesive separately as a connecting element and a process for mounting may be simplified correspondingly.

In the third to the fifth embodiments, a contact area adhering to a conductive adhesive increases and simultaneously anchor effect resulting from the roughness operates effectively by roughening a surface of an external electrode of an electronic part and therefore the adhesion strength is enhanced.

Further, since a surface of an external electrode is coarse when the surface is formed with a sintered silver or a sintered copper, sufficient adhesion strength and reliability may be attained in adhesion using the conductive adhesive. Most of electronic parts supplied at present utilize sintered silvers or sintered coppers as groundwork for solder plating and tin plating of an electrode portion. Therefore, an electronic part having a sintered silver or a sintered copper as a surface portion of an external electrode is readily available and does not require for an additional technology and an capital investment in manufacturing it. In addition to this, since processes for solder plating and tin plating may be eliminated, a manufacturing cost may also be reduced.

Thus, in accordance with the present invention, it may also be realized that an electronic part and an electronic part mounting element are brought to be lead-free, and therefore it is useful for the environmental problems becoming a focus of attention in recent years.

While the invention has been described in detail in connection with the most preferred example, various modifications of combination and arrangement of the components in the preferred embodiments may be made without departing from the spirit and scope of the invention claimed hereinafter.

What is claimed is:

1. An electronic part comprising:
   an external electrode; and
   a coating including a thermoplastic or thermosetting resin disposed on a surface of said external electrode,
   wherein a conductive adhesive layer is provided on said coating and said conductive adhesive layer contains a conductive filler consisting of gold, silver, platinum, nickel, zinc, palladium, or an alloy or a mixture containing these metals, and
   wherein the thickness of said coating is less than a particle diameter of said conductive filler.

2. The electronic part as set forth in claim 1, wherein said coating contains a conductive filler consisting of gold, silver, platinum, nickel, zinc, palladium, or an alloy or a mixture containing these metals.

3. The electronic part as set forth in claim 1, wherein the surface roughness (Ra) of said external electrode is in the range of 0.1 microns to 10.0 microns.

4. The electronic part as set forth in claim 1, wherein the surface roughness (Ra) of said external electrode is in the range of 0.1 microns to 5.0 microns.

5. The electronic part as set forth in claim 1, wherein said coating is disposed over the entire surface of said external electrode.

6. An electronic part mounting element comprising:

an electronic part;

a coating containing a resin ingredient and formed on a surface of an external electrode of said electronic part;

an element to be mounted with said electronic part; and a conductive adhesive containing a conductive filler for electrically connecting the external electrode of said electronic part to a connecting terminal of said element to be mounted, wherein the thickness of said coating is less than a particle diameter of said conductive filler.

7. An electronic part mounting element as set forth in claim 6, wherein said coating and said conductive adhesive are combined into one element.

8. The electronic part mounting element as set forth in claim 7, wherein a joining portion of said coating with said conductive adhesive is shaped like a fillet.

9. The electronic part mounting element as set forth in claim 6, wherein the surface roughness (Ra) of said external electrode is in the range of 0.1 microns to 10.0 microns.

10. The electronic part mounting element as set forth in claim 6, wherein the surface roughness (Ra) of said external electrode is in the range of 0.1 microns to 5.0 microns.

11. An electronic part mounting element comprising:

at least two external electrodes;

a coating of a conductive adhesive containing a conductive filler formed on the entire surface of each of the external electrodes of the electronic part, wherein each of said external electrodes of said electronic part is electrically connected to a connecting terminal of an element on which said electronic part is to be mounted, said coating operative as a connecting element for connecting each of said external electrodes to said connecting terminal, wherein said conductive filler consists of gold, silver, platinum, nickel, zinc, palladium, or an alloy or a mixture containing these metals, and wherein the thickness of said coating is less than a particle diameter of said conductive filler.

12. The electronic part mounting element as set forth in claim 11, wherein the surface roughness (Ra) of said external electrode is in the range of 0.1 microns to 10.0 microns.

13. The electronic part mounting element as set forth in claim 11, wherein the surface roughness (Ra) of said external electrode is in the range of 0.1 microns to 5.0 microns.

14. An electronic part comprising:

an external electrode;

a coating including a thermoplastic or thermosetting resin ingredient is disposed on a surface of said external electrode; and a conductive filler is disposed on said coating;

wherein the thickness of said coating is less than a particle diameter of said conductive filler.

15. The electronic part as set forth in claim 14, wherein the surface roughness (Ra) of said external electrode is in the range of 0.1 microns to 10.0 microns.

16. The electronic part as set forth in claim 14, wherein the surface roughness (Ra) of said external electrode is in the range of 0.1 microns to 5.0 microns.

* * * * *